United States Patent [19]

Ko et al.

[11] Patent Number: 5,399,900
[45] Date of Patent: Mar. 21, 1995

[54] ISOLATION REGION IN A GROUP III-V SEMICONDUCTOR DEVICE AND METHOD OF MAKING THE SAME

[75] Inventors: Kei-Yu Ko, Rochester; Samuel Chen, Penfield; Shuit-Tong Lee, Webster, all of N.Y.

[73] Assignee: Eastman Kodak Company, Rochester, N.Y.

[21] Appl. No.: 133,552

[22] Filed: Oct. 8, 1993

Related U.S. Application Data

[63] Continuation-in-part of Ser. No. 17,315, Feb. 11, 1993, abandoned, which is a continuation of Ser. No. 787,479, Nov. 4, 1991, abandoned.

[51] Int. Cl.$^6$ ............... H01L 27/02; H01L 27/12
[52] U.S. Cl. ................... 257/607; 257/289; 257/499; 257/617
[58] Field of Search .............. 257/183, 289, 607, 617, 257/499, 523

[56] References Cited

U.S. PATENT DOCUMENTS 4,837,178  6/1989  Ohshima et al. ............... 437/33
5,043,777  8/1991  Srirnm ........................ 357/16

FOREIGN PATENT DOCUMENTS 1-110788  4/1989  Japan ....................... 357/16

OTHER PUBLICATIONS

Ko et al, "Correlation of Void Formation With the Reduction of Carrier Activation and Anomalous Dopant Diffusion in Si-Implanted GaAs", Procedures of Material Research Symposium, vol. 163, pp. 983–986 (1990).

Lee et al, "Void formation, electrical activation, and layer intermixing in Si-implanted GaAs/AlGaAs superlattices", Applied Physics Letters, vol. 57(4), pp. 389–391, Jul. 23, 1990.

*Primary Examiner*—Ngan V. Ngo
*Attorney, Agent, or Firm*—Raymond L. Owens

[57] ABSTRACT

A semiconductor device having in a body of a group III-V semiconductor material at least one isolation region which is stable at temperatures up to about 900° C. The isolation region is formed of ions of a group III or V element which are implanted into the body and then thermally annealed at a temperature of between 650° C. and 900° C. This provides the regions with voids which remove free carriers and makes the region highly resistive.

26 Claims, 4 Drawing Sheets

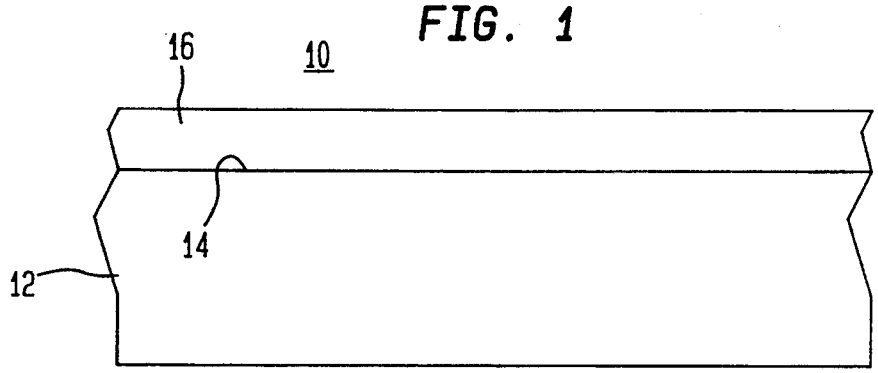
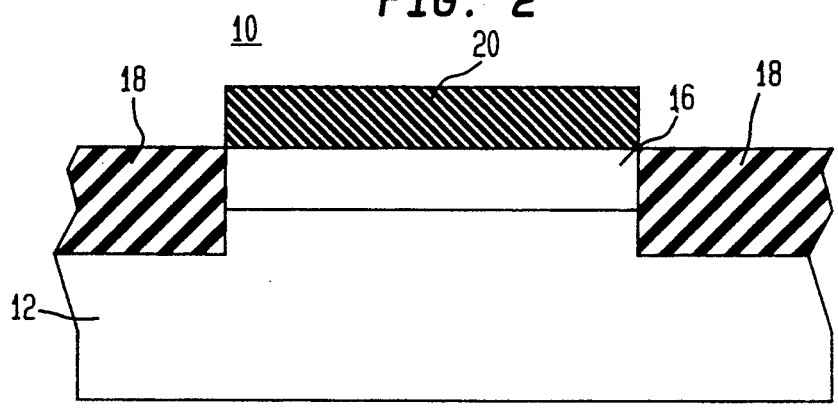
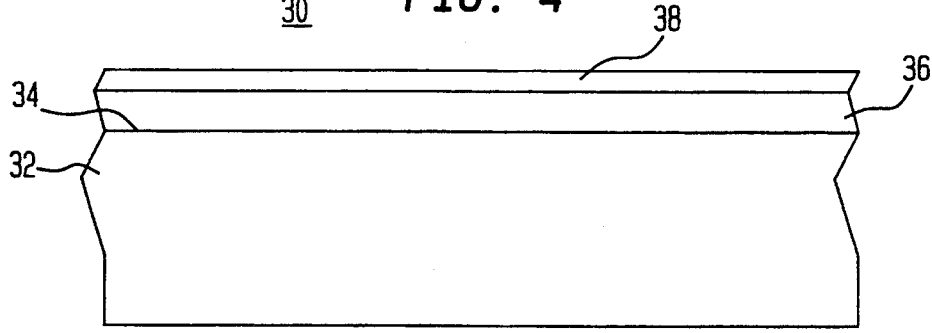

ISOLATION REGION IN A GROUP III-V SEMICONDUCTOR DEVICE AND METHOD OF MAKING THE SAME

CROSS REFERENCE TO RELATED APPLICATION

This application is a continuation-in-part application of parent application Ser. No. 08/017,315, filed Feb. 11, 1993, now abandoned the contents of which are incorporated herein by reference, which in turn is a continuation application of grandparent application Ser. No. 07/787,479, filed Nov. 4, 1991, now abandoned.

FIELD OF THE INVENTION

The present invention relates to a semiconductor device of a group III-V semiconductor material having isolation regions and a method of making the same, and, more particularly, to an isolation region for a group III-V semiconductor device which withstands high temperatures and a method of making the same.

BACKGROUND OF THE INVENTION

There are two basic structures for forming semiconductor devices, particularly for integrated circuits, using a group III-V semiconductor material, such as gallium arsenide. One structure comprises an outer layer of the semiconductor material of one conductivity type on a substrate body of a semi-insulating group III-V semiconductor material. The outer layer is generally epitaxially deposited on the substrate body. A buffer layer of the semiconductor material may be provided between the outer layer and the substrate body. Various semiconductor devices, such as field-effect transistors and millimeter wave transistors or diodes, are formed in the outer layer and electrically connected in a desired circuit. Another structure comprises regions of one conductivity type, such as n-type, in a substrate body of semi-insulating group III-V semiconductor material, such as gallium arsenide. The regions can be formed by ion implantation. The semiconductor devices are formed in the regions and electrically connected in a desired circuit.

In such integrated circuits it is necessary to provide isolation regions in the substrate body between the devices to electrically isolate the devices from each other. In the integrated circuit which comprises an active layer on a semi-insulating substrate body, electrical isolation can be achieved by etching grooves through the outer layer to the substrate to provide areas of the active layer which are separated from each other by the grooves. However, to etch the isolation grooves is a time consuming and expensive operation. Also, the surface of the device is no longer planar and thus it is difficult to form conductors on the device to connect the individual devices in a desired circuit. The device can be made planar by filling the grooves with an insulating material. However, this further increases the cost of making the device.

Isolation regions can also be achieved by implanting ions of such species as oxygen, proton, boron, argon, etc., into areas of the outer layer where isolation regions are desired. The mid-gap energy levels associated with the ion bombardment-induced damage are responsible for the compensation of free carriers and thus turn the implanted regions highly resistive. The technique of using damage-related compensation has several disadvantages. One of the disadvantages is that the high resistivity characteristic of the implanted region is not stable with respect to high temperature thermal processes. This happens because of the annealing out of the bombardment-induced damage in the implanted regions during high temperature treatments. Upon annealing, the sheet resistivity of these regions drops from values acceptable for isolation purposes to the original non-implanted value. The temperature at which the sheet resistivity returns to its original non-implanted value, and thus the implanted regions becomes ineffective for isolation, depends on the implanted species and is about 400° C. for proton, 600° C. for boron and 700° C. for oxygen implants.

The return of high resistivity of the implanted regions formed by the implantation of the ions to the original non-implanted state upon high temperature processing imposes a limitation in using them for GaAs device processing. Processing of GaAs devices often requires high temperature steps (i.e., temperature steps of greater than 700° C.). Therefore, these high temperature process steps have to be carried out prior to the isolation implant.

Another disadvantage of this ion implantation method for forming isolation regions is that the implanted ions become foreign chemical species to the host crystal. These species can potentially lead to deleterious generic impurity effect on devices subsequently built in the host crystal.

Therefore, it would be desirable to have an implant isolation technique with improved high temperature thermal stability of the implanted regions (i.e., stability at temperature up to 900° C. which is typically the highest processing temperature for GaAs devices) to provide greater flexibility for process design. Also, it is desirable for the implanted species be of the type which do not perturb the electrical and crystal properties of the host material.

SUMMARY OF THE INVENTION

The present invention relates to an isolation region in a body of a group III-V semiconductor material which will withstand and is stable at temperatures of up to at least 900° C. A semiconductor device having such an isolation regions includes a body of a group III-V semiconductor material having a surface and the isolation region in the body extending from the surface. The isolation region contains voids which remove free carriers and make the region highly resistive. The isolation regions are formed by implanting ions of a group III or V element into a region of the body and heating the body at a temperature at which voids form.

Voids, as used herein, have an observable morphology. They are pseudo-spherical with a diameter of 1–10 nm and have (111) and (110) facets with respect to the surrounding GaAs structure lattice. Voids are distinctly different from implantation disordered or damaged regions, which may contain a lot of microscopic "vacancy-type" lattice defects, which are atomic positions that are left vacant after their atoms have been displaced (e.g., by the implantation knock-on collision process).

The invention will be better understood from the following more detailed description taken with the accompanying drawings.

BRIEF DESCRIPTION OF THE DRAWINGS

FIG. 1 shows a cross-sectional view of a typical starting structure of a group III–V semiconductor device to be provided with an isolation region in accordance with the present invention;

FIG. 2 shows a cross-sectional view of a partially completed semiconductor device illustrating the method of the present invention for making the isolation regions;

FIG. 4 shows a cross-sectional view of a starting structure for one form of a semiconductor device to be formed with isolation regions in accordance with the present invention;

Figure 3:
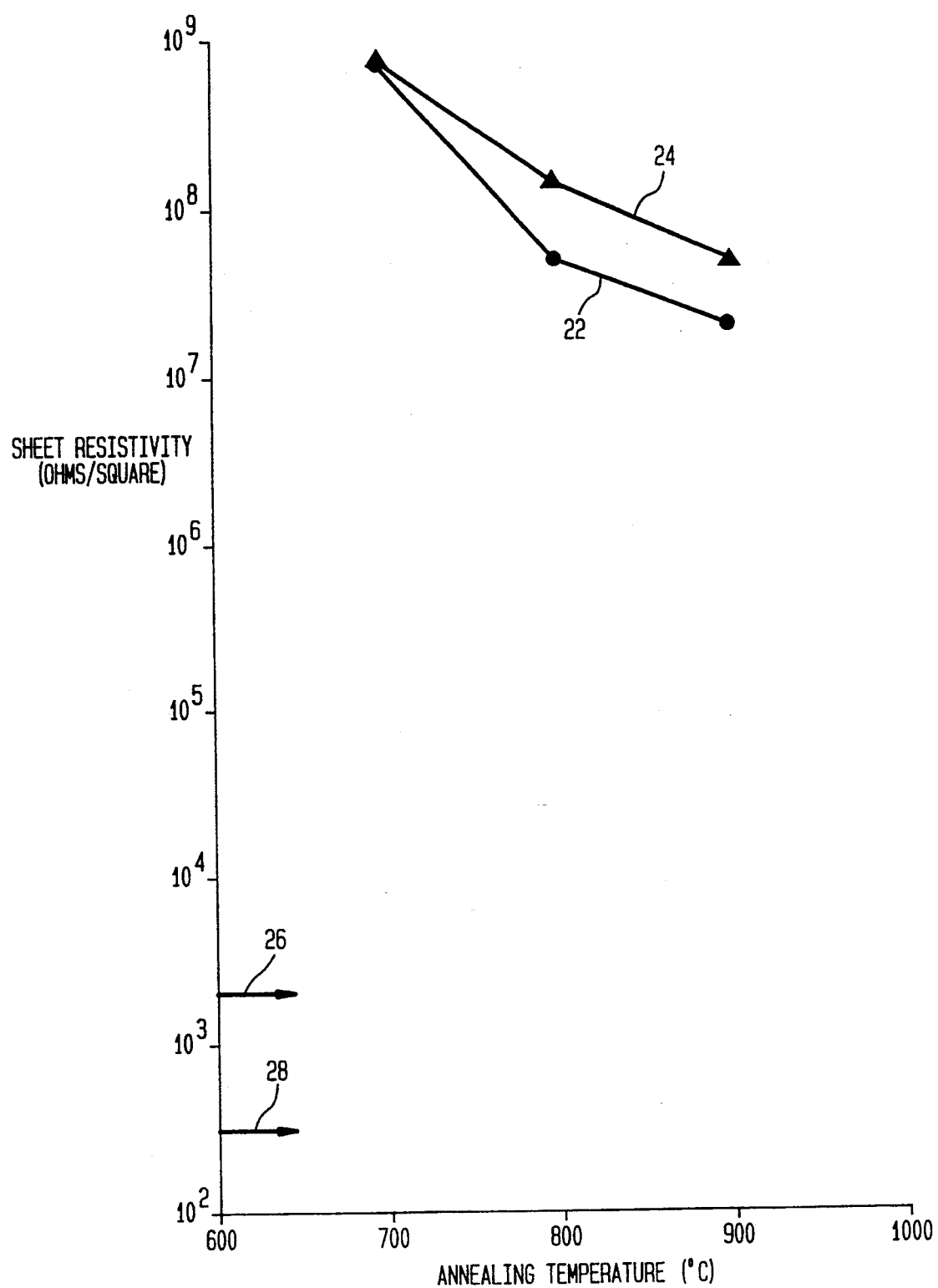
FIG. 3 shows a graph showing the sheet resistivity vs. annealing temperature for isolation regions made in accordance with the method of the present invention.

The drawings are not necessarily to scale.

DETAILED DESCRIPTION

Referring now to FIG. 1, there is shown a cross-sectional view of the starting structure of a semiconductor device 10 which is to be provided with an isolation region in accordance with the present invention. The semiconductor device 10 comprises a substrate body 12 of, a semi-insulating group III–V semiconductor material, such as gallium arsenide, having a surface 14. Along the surface 14 is an active layer 16 of a group III–V semiconductor material, such as gallium arsenide, of one conductivity type, typically n-type. The active layer 16 may be grown on the surface 14 of the body 12 using any well known epitaxial deposition technique, such as the metal organic chemical vapor deposition (MOCVD) technique. The active layer 16 can also be formed by direct ion implantation of donor species, such as silicon or selenium into the unmasked semi-insulating body 12 followed by appropriate thermal annealing to activate the implanted dopant.

Referring now to FIG. 2, there is shown a cross-sectional view of the semiconductor device 10 having spaced apart isolation regions 18 extending through the active layer 16 into the body 12. The isolation regions 18 are formed by implanting into the active layer 16 and the body 12 charged particles (ions) of a group III or V element, such as aluminum, arsenic, gallium or the like. The dose of the implanted particles is high enough to facilitate void formations. The dose is also determined by the concentration of free carriers in the active layer 16 which have to be removed and the temperature at which the implantation is done. For implanting ions of aluminum in gallium arsenide at room temperature, the dose of the ions should be at least $5 \times 10^{13}$ impurities/cm$^2$. For heavier ions, the dose should be less, and for lighter ions, the dose should be greater. For a light atomic species such as Al or Si, it is particularly desirable to use a dose not less than $5 \times 10^{13}$ ions/cm$^2$ and not greater than $1 \times 10^{14}$ ions/cm$^2$. If a higher atomic weight species such as Zn or Ga is used, the above range is unacceptable because too much damage to the material occurs. In fact, it is known that Zn implantation at a dose of $5 \times 10^{13}$ ions/cm$^2$ is sufficient to completely amorphize GaAs. In such a case, it is not possible to form voids in the GaAs after being amorphized.

Although the body is generally held at room temperature during the implantation, it can be cooled to a low temperature so that a lower ion dose may be used. To define the area of the implantation which forms the isolation regions 18, a masking layer 20, such as a photoresist, is provided over the area of the active layer 16 where the semiconductor devices are to be formed. The particles are then implanted into the exposed areas of the active layer 16 and the underlying areas of the substrate 12. Alternatively, a scanned ion beam can be used for maskless selective area implantation.

Following the isolation implant, the masking layer 20 is removed and a thermal annealing of the body 12 is carried out at a temperature of at least 650° C. This promotes the formation of voids in the implanted regions. The annealing can be carried out with a cap layer, such as a thin film of silicon nitride deposited by plasma enhanced chemical vapor deposition technique, over the active layer 16, or under an atmosphere of arsine to prevent surface dissociation. The body 12 is advantageously annealed for 5 to 20 seconds according to rapid thermal annealing. The examples of the present invention were annealed for about 10 seconds. The main defects formed in the implanted and annealed isolation regions 18 are microscopic voids as seen by transmission electron microscopy. Although a low density of dislocation loops are also found in the isolation regions 18, they are not primarily responsible for high resistivity formation. The voids are the major defect responsible for making the implanted regions 18 highly resistive by removing free carriers from the regions 18.

Referring now to FIG. 3, there is shown a graph of sheet resistivity (ohm/square) along the abscissa vs annealing temperature (°C.) along the ordinate for two isolation regions made in accordance with the present invention. A line 22 is for an isolation region which was implanted with ions of aluminum at a concentration of $5 \times 10^{13}$ impurities/cm$^2$ and a line 24 is for an isolation region which was implanted with ions of aluminum at a concentration of $1 \times 10^{14}$ impurities/cm$^2$. A range of annealing temperatures from 700° C.–900° C. is shown. As can be seen from this graph, even after the implanted regions were annealed at a temperature of 900° C., they still had a resistivity of greater than $10^7$ ohms/square, a value sufficient to provide good electrical isolation. An arrow 26 indicates the original level of resistivity before ion implantation of the isolation region having the lower dose of the ions, and an arrow 28 indicates the original level of resistivity before ion implantation of the isolation region having the higher dose of the ions. Thus, it can be seen that the annealing step is important to forming isolation regions 18 having high resistivities.

After the isolation regions 18 are formed, various semiconductor devices can be formed in the area of the active layer 16 between the isolation regions 18. Since the isolation regions 18 can withstand high temperatures, they will withstand any implantation and annealing operations which may be required to form the devices. In fact, the annealing step for forming the isolation regions 18 can be carried out either before, after or simultaneously with any annealing step required to form the devices.

Figure 5:
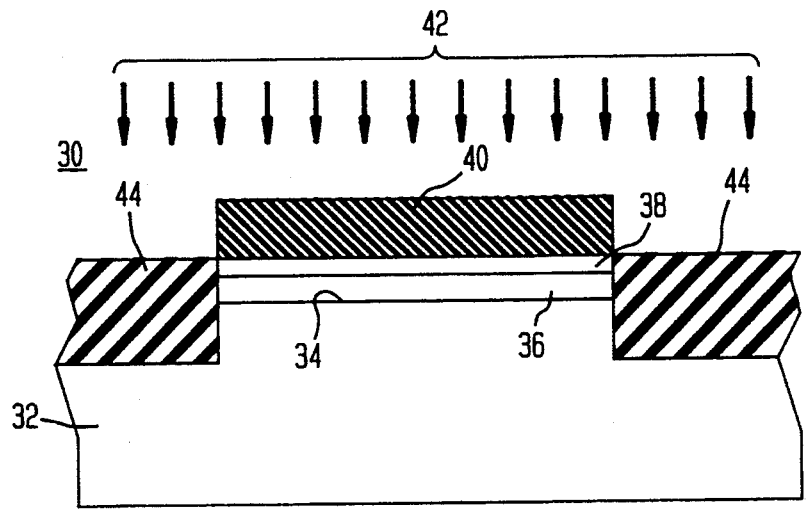
FIG. 5 shows a cross-sectional view of a partially completed semiconductor device illustrating a method of making isolation regions in accordance with the present invention.

Referring now to FIGS. 4 and 5, there is shown cross-sectional views of one form of a starting structure (FIG. 4) and subsequent structure (FIG. 5) typically used to form a gallium arsenide metal-semiconductor field effect transistor 30 for a microwave or millimeter-wave integrated circuit. The transistor 30 starts with a substrate body 32 of semi-insulating gallium arsenide having a surface 34. On the surface 34 is an active layer 36 of n-type conductivity gallium arsenide having a carrier concentration in the range of 1 to $2 \times 10^{17}$ impurities/cm$^3$ and a thickness of about 1000–2000 angstroms. On the active layer 36 is a contact layer 38 of n+ type conductivity having a carrier concentration in the range of 1 to $3 \times 10^{18}$ impurities/cm$^3$ and a thickness of about 1000–2000 angstroms. The layers 36 and 38 are formed by epitaxial deposition techniques.

As shown in FIG. 5, a masking layer 40 is formed over the areas of the layers 36 and 38 where the transistors are to be formed. The masking layer 40 is typically a positive photoresist deposited over the contact layer 38 and patterned by photolithographic techniques. As indicated by the arrows 42, ions of a group III or V elements, such as aluminum, are then implanted into the layers 36 and 38 and the body 32 through openings in the masking layer 40. For implanting aluminum, multiple implants with doses of $1 \times 10^{14}$ impurities/cm$^2$, at 220 keV, and $8 \times 10^{13}$ impurities/cm$^2$ at 350 keV, are performed. The ions are implanted with the body 32 being at room temperature. Following the implant, the body 32 is annealed at a temperature of between 650° C. and 900° C. to turn the implanted regions into highly resistive isolation regions 44. The annealing can be done with a cap layer, typically a 1000 angstrom thick silicon nitride layer, or in an arsine ambient to prevent surface dissociation. The body 32 is now ready for further processing to complete the transistor 30. During additional processing steps, the isolation regions 44 remain highly resistive as long as such steps are performed at temperatures no greater than about 950° C.

Figure 6:
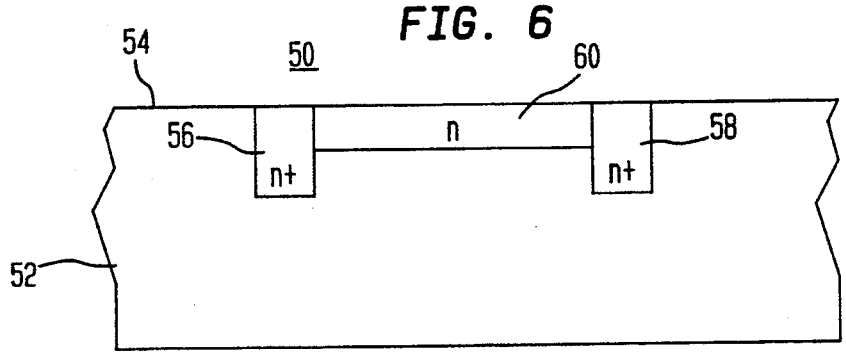
FIG. 6 shows a cross-sectional view of a starting structure for another form of a semiconductor device to be formed with isolation regions in accordance with the present invention.
Figure 7:
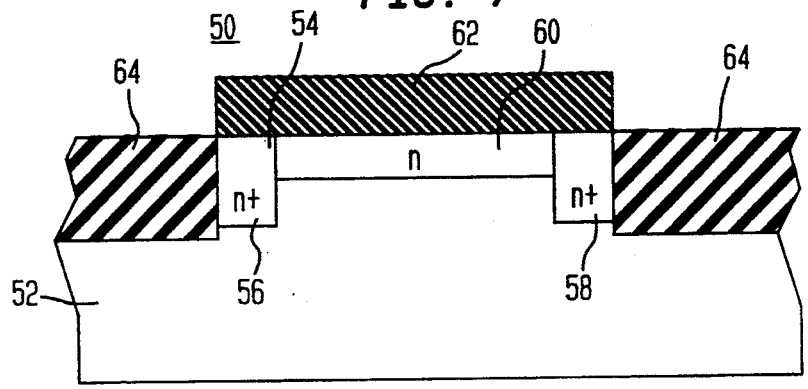
FIG. 7 shows a cross-sectional view of a partially completed semiconductor device.

Referring now to FIGS. 6 and 7, there is shown cross-sectional views of a starting structure (FIG. 6) and partially completed structure (FIG. 7) of another form of a field effect transistor 50. The transistor 50 comprises a body 52 of semi-insulating gallium arsenide having a surface 54. In the body 52 and at the surface 54 are spaced apart source and drain regions 56 and 58 of n+ type conductivity. In the body 52 and between the source and drain regions 56 and 58 is a channel region 60 of n-type conductivity. The source and drain regions 56 and 58 are implanted at a dose of $3 \times 10^{13}$ impurities/cm$^2$ at an energy of 50 keV, and the channel region 60 is implanted at a dose of $3 \times 10^{12}$ impurities/cm$^2$ at an energy of 220 keV. Transistor 50 is a n-channel depletion mode field effect transistor.

Figure 8:
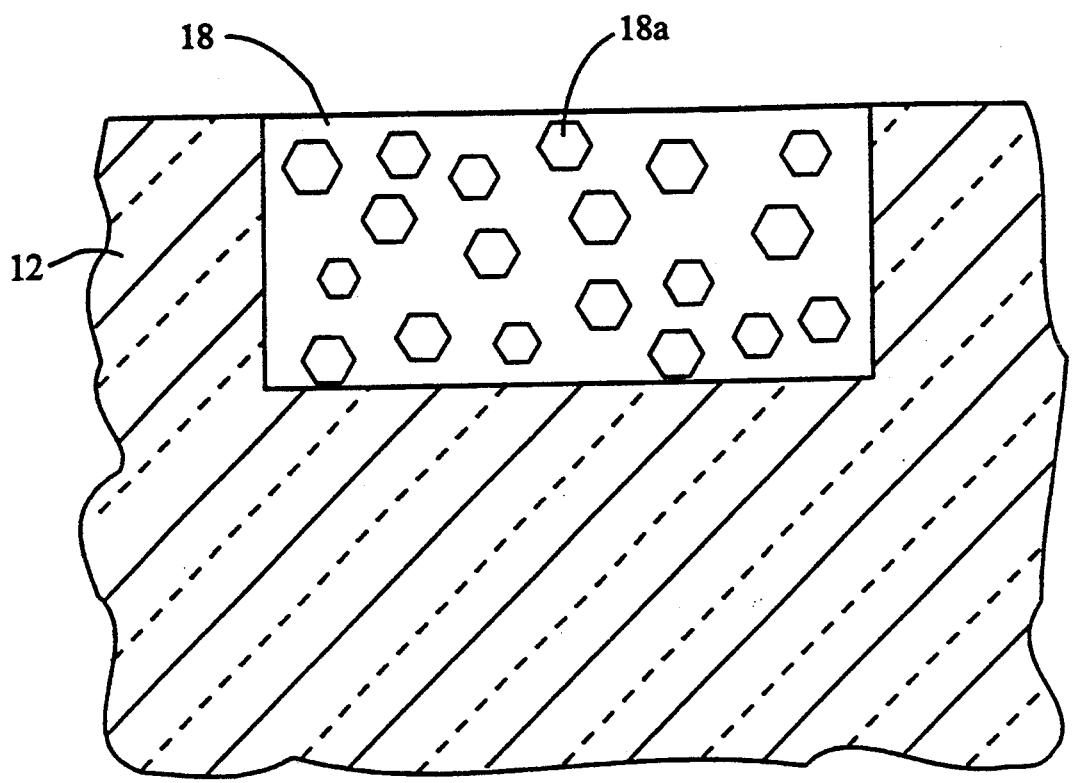
FIG. 8 depicts the isolation region formed in the semiconductor body.

As shown in FIG. 7, a photoresist mask 62 is deposited and patterned to extend over the source and drain regions 56 and 58 and the channel region 60 using photolithographic techniques. Ions of a group III or V element, such as aluminum, are then implanted into the body 52 adjacent the source and drain regions 56 and 58 through openings in the mask 62 to form isolation regions 64. The isolation implants are multiple implants of the aluminum ions with doses of $1 \times 10^{14}$ impurities/cm$^2$ at 220 keV and $8 \times 10^{13}$ impurities/cm$^2$ at 350 keV. The body surface 54 is capped with a 1000 angstrom thick layer of silicon nitride (not shown) and subjected to a thermal annealing. For example, the body 52 can be annealed at 900° C. to simultaneously achieve both optimum electrical activation for the source and drain regions 56 and 58 and the channel region 60 and turn the aluminum implanted isolation regions 64 highly resistive. Contacts (not shown) can then be applied to the channel region 60 and the source and drain regions 56 and 58 to complete the transistor 50. FIG. 8 depicts the voids 18a formed in the isolation region 18 of the semiconductor body 12. The voids have an observable morphology in that they are pseudo-spherical with a diameter of 1–10 nm and have (111) and (110) facets with respect to the surrounding GaAs lattice structure.

Thus, there is provided by the present invention a semiconductor device formed of a group III–V semiconductor material having isolation regions which are highly resistive and which retain their high resistivity even when subjected to temperatures up to about 900° C. Also, there is provided a method of making such isolation regions by implanting ions of a group III or V element into the semiconductor body and then thermally annealing the body at a temperature of about 650° C. Also, the isolation regions are formed with isoelectronic elements which do not perturb the electrical and crystal properties of the host material since they are related to the host material. In addition, the thermal annealing step used to form the isolation regions can also be used to activate implanted dopants used to form portions of the semiconductor device being formed.

It is to be appreciated and understood that the specific embodiments of the invention are merely illustrative of the general principles of the invention. Various modifications may be made consistent with the principles set forth. For example, the various structures of the semiconductor device being formed can be made prior to forming the isolation regions. Still further, the annealing of the isolation regions can be carried out prior to, after or simultaneously with the annealing of other features of the semiconductor device. Furthermore, although the present invention has been described as making field effect transistors, it can be used to form other electronic devices in a group III–V semiconductor body, such as laser diodes and photodetectors.

What is claimed is:

1. A semiconductor device, comprising:
    a body of a group III–V semiconductor material having a surface; and
    a first isolation region in the body extending from the surface, said first isolation region being implanted with one of aluminum and silicon at a level ranging from about $5 \times 10^{13}$ ions/cm$^2$ to $1 \times 10^{14}$ ions/cm$^2$, said first isolation region containing voids which remove free carriers and make the first isolation region highly resistive.

2. The semiconductor device of claim 1, wherein the semiconductor device is annealed for about 5 to 20 seconds after implantation of the first isolation region.

3. The semiconductor device of claim 1, wherein the semiconductor device is annealed at a temperature of not less than 650° C. after implantation of the first isolation region.

4. The semiconductor device of claim 1, wherein the first isolation region has a sheet resistivity of at least 107 ohms/square.

5. The semiconductor device of claim 1, wherein the body is comprised of a semi-insulating material.

6. The semiconductor device of claim 5, wherein the semi-insulating material is GaAs.

7. The semiconductor device of claim 1, further comprising a layer of group III–V semiconductor material of one conductivity type on the surface of the body, wherein the first isolation region extends through the layer and into the body.

8. The semiconductor device of claim 1, further comprising a second isolation region in the body, said second isolation region being spaced apart from the first isolation region.

9. The device of claim 8, wherein the second isolation region is also implanted with one of Al and Si.

10. The semiconductor device of claim 9, wherein the semiconductor device is annealed for about 5 to 20 seconds after implantation of the first and second isolation regions.

11. The semiconductor device of claim 9, wherein the second isolation region is implanted at a level not less than $5 \times 10^{13}$ ions/cm$^2$ and not greater than $1 \times 10^{14}$ ions/cm$^2$.

12. The semiconductor device of claim 9, wherein the semiconductor device is annealed at a temperature of not less than 650° C. after implantation of the first and second isolation regions.

13. The semiconductor device of claim 9, wherein the first and second isolation regions have a sheet resistivity of at least $10^7$ ohms/square.

14. The semiconductor device of claim 9, wherein the body is comprised of a semi-insulating material.

15. The semiconductor device of claim 14, wherein the semi-insulating material is GaAs.

16. The semiconductor device of claim 9, further comprising a layer of group III–V semiconductor material of one conductivity type on the surface of the body, wherein the first and second isolation regions extend through the layer and into the body.

17. The semiconductor device of claim 1, wherein the voids are pseudo-spherical with a diameter of about 1–10 nm.

18. The semiconductor device of claim 17, wherein the voids have (111) and (110) facets with respect to the lattice structure of the isolation region.

19. The semiconductor device of claim 1, wherein said semiconductor material is n-type.

20. An apparatus comprising:
 a body of group III–V semiconductor material having a surface;
 at least two semiconductor devices formed on said surface of said body; and
 an isolation region formed in said body between said semiconductor devices, said isolation region being implanted with one of aluminum and silicon at a level ranging from about $5 \times 10^{13}$ ions/cm$^2$ to $1 \times 10^{14}$ ions/cm$^2$, said isolation region containing voids which remove free carriers and make said isolation region highly resistive.

21. The apparatus of claim 20, wherein said semiconductor material is n-type.

22. The apparatus of claim 20, wherein the apparatus is annealed for about 5 to 20 seconds after implantation of said isolation region.

23. The apparatus of claim 20, wherein the apparatus is annealed at a temperature of not less than 650° C. after implantation of said isolation region.

24. The apparatus of claim 20, wherein said isolation region has a sheet resistivity of at least $10^7$ ohms/square.

25. The apparatus of claim 20, said body comprises semi-insulating material.

26. The apparatus of claim 25, wherein said semi-insulating material is GaAs.

* * * * *

UNITED STATES PATENT AND TRADEMARK OFFICE
CERTIFICATE OF CORRECTION

PATENT NO. : 5,399,900
DATED : March 21, 1995
INVENTOR(S) : Kei-Yu Ko, Samuel Chen, Shuit-Tong Lee It is certified that error appears in the above-indentified patent and that said Letters Patent is hereby corrected as shown below:

Column 6, line 63, "107" should read --$10^7$--.

Signed and Sealed this

Eighth Day of August, 1995

*Attest:*

BRUCE LEHMAN

*Attesting Officer*  *Commissioner of Patents and Trademarks*